(12) United States Patent
Mori et al.

(10) Patent No.: US 7,147,983 B1
(45) Date of Patent: Dec. 12, 2006

(54) DYED PHOTORESISTS AND METHODS AND ARTICLES OF MANUFACTURE COMPRISING SAME

(75) Inventors: James Michael Mori, Dorchester, MA (US); James W. Thackeray, Braintree, MA (US); Roger F. Sinta, Woburn, MA (US); Rosemary Bell, Wayland, MA (US); Robin L. Miller-Fahey, Marlborough, MA (US); Timothy G. Adams, Sudbury, MA (US); Thomas M. Zydowsky, Cambridge, MA (US); Edward K. Pavelchek, Stow, MA (US); Manuel doCanto, Stoughton, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 08/726,613

(22) Filed: Oct. 7, 1996

(51) Int. Cl.
*G03F 7/04* (2006.01)

(52) U.S. Cl. .................. 430/270.1; 430/905; 430/910; 430/926

(58) Field of Classification Search ............. 430/270.1, 430/910, 920, 922, 926, 340, 343, 905
See application file for complete search history.

(56) References Cited

U.S. PATENT DOCUMENTS

| | | | | |
|---|---|---|---|---|
| 3,813,245 A | * | 5/1974 | Laridon et al. | 430/343 |
| 3,817,752 A | * | 6/1974 | Laridon et al. | 430/343 |
| 3,820,995 A | * | 6/1974 | Mertens et al. | 430/343 |
| 4,442,197 A | | 4/1984 | Crivello et al. | 430/270.1 |
| 4,603,101 A | | 7/1986 | Crivello | 430/270.1 |
| 4,624,912 A | | 11/1986 | Zweifel et al. | 430/258 |
| 5,045,433 A | * | 9/1991 | Kakumaru et al. | 430/920 |
| 5,089,377 A | * | 2/1992 | Kakumaru et al. | 430/920 |
| 5,128,232 A | | 7/1992 | Thackeray et al. | 430/192 |
| 5,212,046 A | * | 5/1993 | Lamola et al. | 430/926 |
| 5,250,395 A | | 10/1993 | Allen et al. | |
| 5,272,042 A | * | 12/1993 | Allen et al. | 430/920 |
| 5,296,332 A | * | 3/1994 | Sachdev et al. | 430/270.1 |
| 5,334,484 A | * | 8/1994 | Minami et al. | 430/920 |
| 5,346,805 A | * | 9/1994 | Kondo et al. | 430/926 |
| 5,391,465 A | * | 2/1995 | Feely | 430/922 |
| 5,629,135 A | * | 5/1997 | Kobayashi et al. | 430/270.1 |
| 5,654,376 A | * | 8/1997 | Knors et al. | 430/270.1 |
| 6,136,498 A | * | 10/2000 | Jagannathan et al. | 430/270.1 |

FOREIGN PATENT DOCUMENTS

| | | |
|---|---|---|
| EP | 0 366 503 | 5/1990 |
| EP | 0 542 008 A1 | 5/1993 |
| EP | 0 543 762 A1 | 5/1993 |
| EP | 0 636 941 A1 | 2/1995 |
| EP | 0 675 410 A1 | 4/1995 |
| EP | 0 698 823 A1 | 5/1996 |
| WO | WO 90/03598 | 4/1990 |

OTHER PUBLICATIONS

Paul et al., "An anthracene-containing PMMA derivative for photoresist and channel waveguide applications", *Thin Solid Films*; vol. 288 (1996) pp. 150-154.

* cited by examiner

*Primary Examiner*—John S. Chu
(74) *Attorney, Agent, or Firm*—Peter F. Corless; Darryl P. Frickey; Edwards Angell Palmer & Dodge LLP

(57) ABSTRACT

The present invention provides new photoresist compositions that comprise a resin binder, a photoactive component, particularly an acid generator, and a dye material that contains one or more chromophores that can reduce undesired reflections of exposure radiation. Preferred dye compounds are polymeric materials that include one or more chromophores such as anthracene and other polycyclic moieties that effectively absorb deep UV exposure radiation.

4 Claims, No Drawings

DYED PHOTORESISTS AND METHODS AND ARTICLES OF MANUFACTURE COMPRISING SAME

BACKGROUND OF THE INVENTION

1. Field of the Invention

This invention relates to new photoresist compositions particularly suitable for deep U.V. exposure and having the capability of forming highly resolved features of submicron dimension.

2. Background Art

Photoresists are photosensitive films for transfer of images to a substrate. They form negative or positive images. After coating a photoresist on a substrate, the coating is exposed through a patterned photomask to a source of activating energy such as ultraviolet light to form a latent image in the photoresist coating. The photomask has areas opaque and transparent to activating radiation that define a desired image to be transferred to the underlying substrate. A relief image is provided by development of the latent image pattern in the resist coating. The use of photoresists is generally described, for example, by Deforest, Photoresist Materials and Processes, McGraw Hill Book Company, New York (1975), and by Moreau, Semiconductor Lithography, Principals, Practices and Materials, Plenum Press, New York (1988).

More recently, certain "chemically amplified" photoresist compositions have been reported. Such photoresists may be negative-acting or positive-acting and rely on many crosslinking events (in the case of a negative-acting resist) or deprotection reactions (in the case of a positive-acting resist) per unit of photogenerated acid. In other words, the photogenerated acid acts catalytically. In the case of the positive chemically amplified resists, certain cationic photoinitiators have been used to induce cleavage of certain "blocking" groups pendant from a photoresist binder, or cleavage of certain groups that comprise a photoresist binder backbone. See, for example, U.S. Pat. Nos. 5,075,199; 4,968,581; 4,883,740; 4,810,613; and 4,491,628, and Canadian Patent Application 2,001,384. Upon selective cleavage of the blocking group through exposure of a coating layer of such a resist, a polar functional group is provided, e.g., carboxyl or imide, which results in different solubility characteristics in exposed and unexposed areas of the resist coating layer.

An important property of a photoresist is image resolution. A developed photoresist image of fine line definition, including lines of sub-micron and sub-half micron dimensions and having vertical or essentially vertical sidewalls is highly desirable to permit accurate transfer of circuit patterns to an underlying substrate.

However, many current photoresists are not capable of providing such highly resolved fine line images.

For example, reflection of activating radiation used to expose a photoresist often poses limits on resolution of the image patterned in the photoresist layer. Reflection of radiation from the substrate/photoresist interface can produce variations in the radiation intensity in the photoresist during exposure, resulting in non-uniform photoresist linewidth upon development. Radiation also can scatter from the substrate/photoresist interface into regions of the photoresist where exposure is not intended, again resulting in linewidth variations. The amount of scattering and reflection will typically vary from region to region, resulting in further linewidth non-uniformity.

Reflection of activating radiation also contributes to what is known in the art as the "standing wave effect". To eliminate the effects of chromatic aberration in exposure equipment lenses, monochromatic or quasi-monochromatic radiation is commonly used in photoresist projection techniques. Due to radiation reflection at the photoresist/substrate interface, however, constructive and destructive interference is particularly significant when monochromatic or quasi-monochromatic radiation is used for photoresist exposure. In such cases the reflected light interferes with the incident light to form standing waves within the photoresist. In the case of highly reflective substrate regions, the problem is exacerbated since large amplitude standing waves create thin layers of underexposed photoresist at the wave minima. The underexposed layers can prevent complete photoresist development causing edge acuity problems in the photoresist profile. The time required to expose the photoresist is generally an increasing function of photoresist thickness because of the increased total amount of radiation required to expose an increased amount of photoresist. However, because of the standing wave effect, the time of exposure also includes a harmonic component which varies between successive maximum and minimum values within the photoresist thickness. If the photoresist thickness is non-uniform, the problem becomes more severe, resulting in variable linewidth control.

Variations in substrate topography also give rise to resolution-limiting reflection problems. Any image on a substrate can cause impinging radiation to scatter or reflect in various uncontrolled directions, affecting the uniformity of photoresist development. As substrate topography becomes more complex with efforts to design more complex circuits, the effects of reflected radiation become more critical For example, metal interconnects used on many microelectronic substrates are particularly problematic due to their topography and regions of high reflectivity.

With recent trends towards high-density semiconductor devices, there is a movement in the industry to shorten the wavelength of exposure sources to deep ultraviolet (DUV) light (300 nm or less in wavelength) including excimer laser light (248.4 nm), ArF excimer laser light (193 nm), electron beams and soft x-rays. The use of shortened wavelengths of light for imaging a photoresist coating has resulted in greater penetration of the photoresist layer and increased reflection of the exposing energy back into the photoresist layer. Thus, the use of the shorter wavelengths has exacerbated the problems of reflection from a substrate surface.

It thus would be desirable to have new photoresist compositions that could provide highly resolved fine line images, including images of sub-micron and sub-half micron dimensions. It would be further desirable to have such new photoresist compositions that could be imaged with deep U.V. radiation. It would be particularly desirable to have such photoresists that reduced reflections of exposure radiation.

SUMMARY OF THE INVENTION

The present invention provides new photoresist compositions that in general comprise a resin binder, a photoactive component, particularly an acid generator, and a dye material that contains one or more chromophores that can reduce undesired reflections of exposure radiation. Preferred dye compounds are polymeric materials (generally referred to herein as "resin dyes") that include one or more chromophores that effectively absorb deep UV exposure radiation.

Preferred chromophores of the dyes of the invention are carbocyclic or heterocyclic polycyclic moieties. Anthracene is a particularly preferred chromophore, including anthracene esters such as groups of the formula —(C=O)O(CH$_2$)$_n$anthracene, wherein n is an integer from 0 to about 6. Other suitable chromophores include quinolinyl and ring-substituted quinolinyl derivatives such as hydroxyquinolinyl, phenanthrenyl and acridine groups.

Generally, about 5 to 90 percent of the units of a resin dye of the invention comprises such chromophores, more preferably about 10 to 80 percent of the resin dye units. Generally, resin dyes of the invention will have a weight average molecular weight of at least about 500 daltons. Preferred resin dyes of the invention have an optical density of at least about 4 units/μ at 248 nm. Copolymer resin dyes are generally preferred, including anthracene copolymers, particularly anthracene/acrylic resins.

It has been found that use of a dye resin of the invention in a photoresist imparts significant lithographic improvements to the resist, including substantial reductions of undesired reflections of exposure radiation and enhanced resolution and masking linearity of developed resist images. See the results of the examples which follow.

The invention further provides methods for forming a relief image and novel articles of manufacture comprising substrates such as a microelectronic wafer or a flat panel display substrate coated with photoresist composition of the invention. Novel polymers are also provided. Other aspects of the invention are disclosed infra.

DETAILED DESCRIPTION OF THE INVENTION

As discussed above, preferred dye compounds of photoresists of the invention include one or more chromophores that can effectively absorb deep UV radiation to prevent or at least significantly reduce undesired reflections of the exposure radiation.

Aromatic groups, particularly polycyclic hydrocarbon or heterocyclic units, are typically preferred deep UV chromophores of the dye compounds, e.g. groups having from two to three or more fused or separate rings with about 3 to 8 ring members in each ring and zero to three N, O or S atoms per ring. Such chromophores include substituted and unsubstituted anthracenyl, substituted and unsubstituted phenanthryl, substituted and unsubstituted acridine, substituted and unsubstituted quinolinyl and ring-substituted quinolinyls such as hydroxyquinolinyl groups.

As discussed above, substituted or unsubstituted anthracenyl groups are particularly preferred chromophores. For example, preferred resin dyes have pendant anthracenyl groups, particularly acrylic resins of the following Formula I:

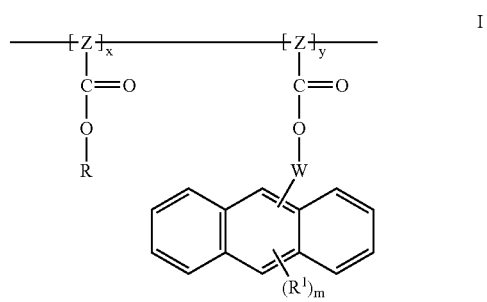

wherein each R is independently substituted or unsubstituted alkyl preferably having about 10 carbon atoms, more typically 1 to about 6 carbons;

W is a bond or substituted or unsubstituted alkylene preferably having 1 to about 4 carbons, and preferably is substituted or unsubstituted methylene (—CH$_2$—);

each R$^1$ may be independently halogen (F, Cl, Br, I); substituted or unsubstituted alkyl preferably having 1 to about 12 carbon atoms; substituted or unsubstituted alkoxy preferably having 1 to about 12 carbon atoms; substituted or unsubstituted alkenyl preferably having 2 to about 12 carbon atoms; substituted or unsubstituted alkynyl preferably having 2 to about 12 carbon atoms; substituted or unsubstituted alkylthio preferably having 1 to about 12 carbon atoms; cyano; nitro; amino; hydroxyl; etc.;

m is an integer of from 0 (where the anthracenyl ring is fully hydrogen-substituted) to 9, and preferably m is 0, 1 or 2;

x is the mole fraction or percent of alkyl acrylate units in the polymer and preferably is from about 10 to about 80 percent;

y is the mole fraction or percent of anthracene units in the polymer and preferably is from about 5 to 90 percent; and each Z is a bridge group between polymer units, e.g. substituted or unsubstituted alkylene preferably having 1 to about 10 carbon atoms, more typically 1 to about 6 carbon atoms, or more preferably 1 to about 3 carbons and optionally substituted by alkyl having 1 to about 3 carbons, or Z is substituted or unsubstituted alkenyl or alkynyl, preferably having 2 to about 10 carbons and optionally substituted by alkyl having 1 to about 3 carbons. The polymer also may contain other units if desired, but preferably the polymer will contain at least about 10 mole percent of anthracene units. Hydroxyalkyl is a particularly preferred R group, especially alkyl having a primary hydroxy group such as where R is 2-hydroxyethylene (—CH$_2$CH$_2$OH). Preferably the resin binder contains 9-(methylene)anthracene ester units (i.e. where W is methylene substituted at the 9-position of the pendant anthracene). A specifically preferred resin dye comprises the structure of Formula III shown in Example 1 which follows.

Other preferred resin dyes of the invention comprise substituted or unsubstituted quinolinyl or a quinolinyl derivative that has one or more N, O or S ring atoms such as a hydroxyquinolinyl. The polymer may contain other units such as carboxy and/or alkyl ester units pendant from the polymer backbone. A particularly preferred resin dye is an acrylic polymer of the following Formula II:

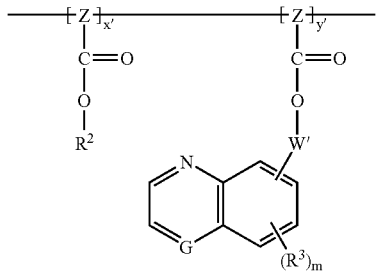

each $R^2$ is independently substituted or unsubstituted alkyl preferably having 1 to about 10 carbon atoms, more typically 1 to about 6 carbons;

W' is a bond or substituted or unsubstituted alkylene preferably having 1 to about 4 carbons, and preferably is a bond;

G is a carbon, nitrogen, oxygen or sulfur;

each $R^3$ may be independently halogen (F, Cl, Br, I); substituted or unsubstituted alkyl preferably having 1 to about 12 carbon atoms; substituted or unsubstituted alkoxy preferably having 1 to about 12 carbon atoms; substituted or unsubstituted alkenyl preferably having 2 to about 12 carbon atoms; substituted or unsubstituted alkynyl preferably having 2 to about 12 carbon atoms; substituted or unsubstituted alkylthio preferably having 1 to about 12 carbon atoms; cyano; nitro; amino; hydroxyl; etc.;

m is an integer of from 0 (where the ring is fully hydrogen-substituted) to 7, and preferably m is 0, 1 or 2.

x' is the mole fraction or percent of alkyl acrylate units in the polymer and preferably is from 10 to about 80 percent;

y' is the mole fraction or percent of quinolinyl or hydroxyquinolinyl units in the polymer and preferably is from about 5 to about 90 percent; and each Z is a bridge group between polymer units, e.g. substituted or unsubstituted alkylene preferably having 1 to about 10 carbon atoms, more typically 1 to about 6 carbon atoms, or more preferably 1 to about 3 carbons and optionally substituted by alkyl having 1 to about 3 carbons, or Z is substituted or unsubstituted alkenyl or alkynyl, preferably having 2 to about 10 carbons and optionally substituted by alkyl having 1 to about 3 carbons. The polymer also may contain other units if desired, but preferably the polymer will contain at least about 10 mole percent of quinolinyl and/or hydroxyquinolinyl units. Hydroxyalkyl is a particularly preferred $R^2$ group, especially alkyl having a primary hydroxy group such as where $R^2$ is 2-hydroxyethylene.

The above-mentioned substituted groups (including substituted groups R, $R^1$, $R^2$, $R^3$, Z, W, W' and substituted chromophores) may be substituted at one or more available positions by one or more suitable groups such as e.g. halogen (particularly F, Cl and Br); cyano; hydroxyl, nitro, alkanoyl such as a $C_{1-6}$ alkanoyl group such as acyl and the like; alkyl groups having from 1 to about 8 carbon atoms; alkenyl and alkynyl groups having one or more unsaturated linkages and 2 to about 8 carbon atoms; alkoxy groups having from 1 to about 6 carbons; etc.

Resin dyes of the invention are preferably synthesized by polymerizing two or more different monomers where at least one of the monomers includes a chromophore group, e.g. an anthracenyl, quinolinyl or hydroxyquinolinyl group. A free radical polymerization is suitably employed, e.g., by reaction of a plurality of monomers to provide the various units in the presence of a radical initiator preferably under an inert atmosphere (e.g., $N_2$ or argon) and at elevated temperatures such as about 70° C. or greater, although reaction temperatures may vary depending on the reactivity of the particular reagents employed and the boiling point of the reaction solvent (if a solvent is employed). See the examples which follow for exemplary reaction conditions. Suitable reaction temperatures for any particular system can be readily determined empirically by those skilled in the art based on the present disclosure. A reaction solvent may be employed if desired. Suitable solvents include alcohols such as propanols and butanols and aromatic solvents such as benzene, chlorobenzene, toluene and xylene. Dimethylsulfoxide, dimethylformamide and THF are also suitable. The polymerization reaction also may be run neat. A variety of free radical initiators may be employed to prepare the copolymers of the invention. For example, azo compounds may be employed such as azobis-2,2'-isobutyronitrile (AIBN) and 1,1'-azobis (cyclohexanecarbonitrile). Peroxides, peresters, peracids and persulfates also can be employed.

Also, while less preferred, a preformed resin may be functionalized with chromophore units to provide the dye. For example, a phenolic resin such as a novolac or poly (vinylphenol) polymer or copolymer can be reacted with an anthranyl carboxylic acid.

Preferably the resin dyes of the invention will have a weight average molecular weight (Mw) of about 500 to about 10,000,000 daltons, more typically about 1,000 to about 1,000,000 daltons, even more typically an Mw of about 5,000 to 200,000 daltons, still more typically about 5,000 to about 110,000 daltons and a molecular number molecular weight (Mn) of about 500 to about 1,000,000 daltons. Particularly preferred are resin dyes having an Mw of at least about 7,000 or 8,000 daltons, and preferably an Mw of less than about 80,000 daltons. Molecular weights (either Mw or Mn) of the polymers of the invention are suitably determined by gel permeation chromatography.

Resin dyes preferably exhibit good absorbance at deep UV wavelengths such as within the range of from 100 to about 300 nm. More specifically, preferred resin binders of the invention have optical densities of at least about 3 absorbance units per micron (Absorb. units/μ) at about 248 nm, preferably from about 5 to 20 or more absorbance units per micron at 248 nm, more preferably from about 8 to 20 or more absorbance units per micron at 248 nm. Higher absorbance values for a particular resin can be obtained by increasing the percentage of chromophore units on the resin. As used herein, optical density of a resin is determined by the following procedure: spin cast a solution of the resin onto a silicon wafer (e.g. 4 inch wafer) and then a polished quartz wafer (e.g. 4 inch wafer). Wafers are soft baked for 60 seconds at approximately 110° C. Coating layer thickness are determined using a Prometrix SM300 Thicknes Measurement tool. Absorbance spectral curves are generated for the coating layers, e.g. using a Cary 13 UV-VIS Spectrophotometer. Absorbances are normalized for a 1.0 μm thick film.

The concentration of a resin dye within a photoresist composition may vary within relatively broad ranges, and in general the resin dye is employed in a concentration of from about 10 to 70 weight percent of the total of the dry components of a photoresist, more typically from about 20 to 50 weight percent of the total dry components (all resist components except solvent carrier).

As discussed above, in addition to dye compound, photoresists of the invention contain resin binder and photoactive components. Negative resists of the invention also include a crosslinking component. The photoactive component may suitably be either a photoacid or a photobase generator, although photoacid generators may be more typically employed, particularly for positive-acting resists.

Preferably the photoresist resin binder has functional groups that impart alkaline aqueous developability to the photoimaged resist composition. Preferred are resin binders that comprise polar functional groups such as hydroxyl or carboxylate and the resin binder is used in a resist composition in an amount sufficient to render the resist developable with an aqueous alkaline solution.

Generally preferred resist resin binders are phenolic resins including phenol aldehyde condensates known in the art as novolak resins, homo and copolymers or alkenyl phenols and homo and copolymers of N-hydroxyphenyl-maleimides.

Examples of suitable phenols for condensation with a aldehyde, especially formaldehyde, for the formation of novolak resins include phenol; m-cresol; o-cresol; p-cresol; 2,4-xylenol; 2,5-xylenol; 3,4-xylenol; 3,5-xylenol; thymol and mixtures thereof. An acid catalyzed condensation reaction results in formation of a suitable novolak resin which may vary in molecular weight (Mw) from about 500 to 100,000 daltons. Poly(vinylphenols) may be prepared, e.g., as disclosed in U.S. Pat. No. 4,439,516. Preferred resin binders and the preparation thereof are also disclosed in U.S. Pat. No. 5,128,230.

Poly(vinylphenols) may be formed by block polymerization, emulsion polymerization or solution polymerization of the corresponding monomers in the presence of a catalyst. Vinylphenols useful for the production of polyvinyl phenol resins may be prepared, for example, by hydrolysis of commercially available coumarin or substituted coumarin, followed by decarboxylation of the resulting hydroxy cinnamic acids. Useful vinylphenols also may be prepared by dehydration of the corresponding hydroxy alkyl phenols or by decarboxylation of hydroxy cinnamic acids resulting from the reaction of substituted or nonsubstituted hydroxybenzaldehydes with malonic acid. Preferred polyvinylphenol resins prepared from such vinylphenols have a molecular weight (Mw) range of from about 2,000 to about 60,000 daltons.

Copolymers containing phenol and nonaromatic cyclic alcohol units also are preferred resin binders for resists of the invention and may be suitably prepared by partial hydrogenation of a novolak or poly(vinylphenol) resin. Such copolymers and the use thereof in photoresist compositions are disclosed in U.S. Pat. No. 5,128,232 to Thackeray et al.

Further preferred resin binders include resins formed from bishydroxymethylated compounds, and block novolak resins. See U.S. Pat. Nos. 5,130,410 and 5,128,230 where such resins and use of same in photoresist compositions is disclosed. Additionally, two or more resin binders of similar or different compositions can be blended or combined together to give additive control of lithographic properties of a photoresist composition. For instance, blends of resins can be used to adjust photospeed and thermal properties and to control dissolution behavior of a resist in a developer.

One suitable class of photoresists of the invention are "conventional" positive-acting resists that comprise a resin dye as discussed above, a photoacid generator that serves as a dissolution rate inhibitor and a resin binder component such as a novolak or poly(vinylphenol) or partially hydrogenated derivative thereof. Photoactivation of a coating layer of the resist results in conversion of the photoactive component to an acidic material, rendering regions of the coating layer containing this acidic photoproduct comparatively more soluble in an aqueous alkaline developer solution than regions that contain only the intact (non-activated) photoactive component. The photoactive component typically used in these positive resists are quinone diazides such as 2,1,4-diazonaphthoquinone sulfonic acid esters and 2,1, 5-diazonaphthoquinone sulfonic acid esters.

In particularly preferred aspects, the invention provides chemically amplified positive-acting resist compositions that contain a resin dye as discussed above. A number of such resist compositions have been described, e.g., in U.S. Pat. Nos. 4,968,581; 4,883,740; 4,810,613; 4,491,628 and 5,492,793, all of which are incorporated herein by reference for their teaching of making and using chemically amplified positive-acting resists. Particularly preferred chemically amplified photoresists of the invention comprise in admixture a photoacid generator and a resin binder that comprises a copolymer containing both phenolic and non-phenolic units. For example, one preferred group of such copolymers has acid labile groups substantially, essentially or completely only on non-phenolic units of the copolymer. One especially preferred copolymer binder has repeating units x and y of the following formula:

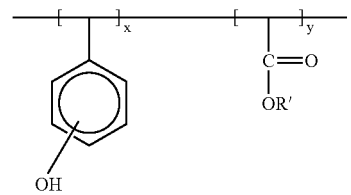

wherein the hydroxyl group be present at either the ortho, meta or para positions throughout the copolymer, and R' is substituted or unsubstituted alkyl having 1 to about 18 carbon atoms, more typically 1 to about 6 to 8 carbon atoms. Tert-butyl is a generally preferred R' group. An R' group may be optionally substituted by e.g. one or more halogen (particularly F, Cl or Br), $C_{1-8}$ alkoxy, $C_{2-8}$ alkenyl, etc. The depicted phenolic units of the polymer also may be optionally substituted by such groups. The units x and y may be regularly alternating in the copolymer, or may be randomly interspersed through the polymer. Such copolymers can be readily formed. For example, for resins of the above formula, vinyl phenols and a substituted or unsubstituted alkyl acrylate such as t-butylacrylate and the like may be condensed under free radical conditions as known in the art. The substituted ester moiety, i.e. R'—O—C(=O)—, moiety of the acrylate units serves as the acid labile groups of the resin and will undergo photoacid induced cleavage upon exposure of a coating layer of a photoresist containing the resin. Preferably the copolymer will have a Mw of from about 8,000 to about 50,000, more preferably about 15,000 to about 30,000 with a molecular weight distribution of about 3 or less, more preferably a molecular weight distribution of about 2 or less. Non-phenolic resins, e.g. a copolymer of an alkyl acrylate such as t-butylacrylate or t-butylmethacrylate and a vinyl alicyclic such as a vinyl norbornyl or vinyl cyclohexanol compound, also may be used as a resin binder in compositions of the invention. Such copolymers also may be prepared by such free radical polymerization or other known procedures and suitably will have a Mw of from about 8,000 to about 50,000, and a molecular weight distribution of about 3 or less. Additional preferred chemically-amplified positive resists are disclosed in U.S. Pat. No. 5,258,257 to Sinta et al.

Preferred negative-acting resist compositions of the invention comprise a resin dye as discussed above and a mixture of materials that will cure, crosslink or harden upon exposure to acid.

Particularly preferred negative-acting resist compositions comprise a resin dye of the invention, a resin binder such as a phenolic resin, a crosslinker component and a photoacid generator. Such compositions and the use thereof have been disclosed in European Patent Applications 0164248 and 0232972 and in U.S. Pat. No. 5,128,232 to Thackeray et al. Preferred phenolic resins for use as the resin binder component include novolaks and poly(vinylphenol)s such as those discussed above. Preferred crosslinkers include amine-based materials, including melamine, glycourils, benzoguanamine-based materials and urea-based materials. Melamine-formaldehyde resins are generally most preferred. Such crosslinkers are commercially available, e.g. the melamine resins sold by American Cyanamid under the trade names Cymel 300, 301 and 303. Glycouril resins are sold by American Cyanamid under trade names Cymel 1170, 1171, 1172, Powderlink 1174, urea-based resins are sold under the trade names of Beetle 60, 65 and 80, and benzoguanamine resins are sold under the trade names Cymel 1123 and 1125.

Sulfonate compounds are generally preferred PAGs, particularly sulfonate salts. Two specifically preferred agents are the following PAGS 1 and 2:

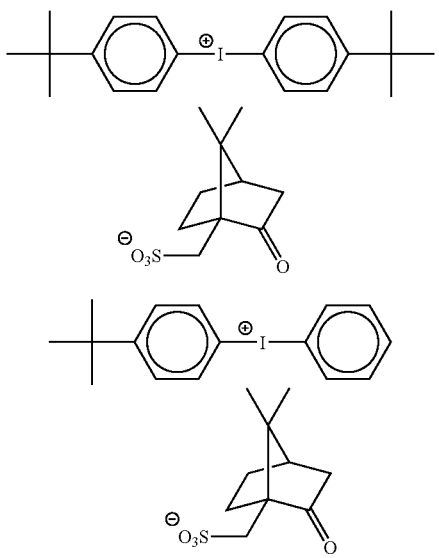

These sulfonate compound can be prepared as disclosed in Example 7 which follows, which details the synthesis of above PAG 1. Sulfonate PAG 2 above can be prepared by the same procedures of Example 7 which follows, except approximately molar equivalents of t-butyl benzene and benzene would be reacted together in the first step with acetic anhydride and $KIO_3$. Also preferred are the above two iodonium compounds with counter anions of trifluoromethylsulfonate ($CF_3SO_3$) and benzenesulfonate. These sulfonate PAGS are particularly preferred for use in the chemically-amplified positive photoresists of the invention.

Other suitable sulfonate PAGS including sulfonated esters and sulfonyloxy ketones. See *J. of Photopolymer Science and Technology*, 4(3):337–340 (1991), for disclosure of suitable sulfonate PAGS, including benzoin tosylate, t-butylphenyl α-(p-toluenesulfonyloxy)-acetate and t-butyl α-(p-toluenesulfonyloxy)-acetate. Preferred sulfonate PAGs are also disclosed in U.S. Pat. No. 5,344,742 to Sinta et al.

Onium salts are also generally preferred acid generators of compositions of the invention. Onium salts that weakly nucleophilic anions have been found to be particularly suitable. Examples of such anions are the halogen complex anions of divalent to heptavalent metals or non-metals, for example, Sb, Sn, Fe, Bi, Al, Ga, In, Ti, Zr, Sc, D, Cr, Hf, and Cu as well as B, P, and As. Examples of suitable onium salts are diaryl-diazonium salts and onium salts of group Va and B, Ia and B and I of the Periodic Table, for example, halonium salts, quaternary ammonium, phosphonium and arsonium salts, aromatic sulfonium salts and sulfoxonium salts or selenium salts. Examples of suitable preferred onium salts can be found in U.S. Pat. Nos. 4,442,197; 4,603,101; and 4,624,912.

Other useful acid generators include the family of nitrobenzyl esters, and the s-triazine derivatives. Suitable s-triazine acid generators are disclosed, for example, in U.S. Pat. No. 4,189,323.

Halogenated non-ionic, photoacid generating compounds are also suitable such as, for example, 1,1-bis[p-chlorophenyl]-2,2,2-trichloroethane (DDT); 1,1-bis[p-methoxyphenyl]-2,2,2-trichloroethane; 1,2,5,6,9,10-hexabromocyclodecane; 1,10-dibromodecane; 1,1-bis[p-chlorophenyl]-2,2-dichloroethane; 4,4-dichloro-2-(trichloromethyl)benzhydrol (Kelthane); hexachlorodimethyl sulfone; 2-chloro-6-(trichloromethyl) pyridine; o,o-diethyl-o-(3,5,6-trichloro-2-pyridyl)phosphorothionate; 1,2,3,4,5,6-hexachlorocyclohexane; N(1,1-bis[p-chlorophenyl]-2,2,2-trichloroethyl) acetamide; tris[2,3-dibromopropyl]isocyanurate; 2,2-bis[p-chlorophenyl]-1,1-dichloroethylene; tris[trichloromethyl]s-triazine; and their isomers, analogs, homologs, and residual compounds. Suitable photoacid generators are also disclosed in European Patent Application Nos. 0164248 and 0232972. Acid generators that are particularly preferred for deep U.V. exposure include 1,1-bis(p-chlorophenyl)-2,2,2-trichloroethane (DDT); 1,1-bis(p-methoxyphenol)-2,2,2-trichloroethane; 1,1-bis(chlorophenyl)-2,2,2 trichloroethanol; tris(1,2, 3-methanesulfonyl)benzene; and tris(trichloromethyl) triazine.

As discussed above, the invention also provides photoresist compositions that include a photobase generator compound, particularly negative base-hardening compositions that contain a dye material of the invention, a resin binder such as the above-discussed phenolic resins, a crosslinker and a photobase generator compound that undergoes a base-promoted crosslinking reaction upon exposure to activating radiation. Suitable photobase generator compounds and the use of base-hardening composition are disclosed in U.S. Pat. No. 5,262,280 to Knudsen et al. Amine-based crosslinkers such as the above-discussed melamine resins are suitable for base-hardening compositions.

Photoresists of the invention also may contain other materials. A preferred optional additive is an added base, particularly tetrabutylammonium hydroxide (TBAH), or lactate salt of TBAH (see Example 7 which follows), which can enhance resolution of a developed resist relief image. The added base is suitably used in relatively small amounts, e.g. about 1 to 20 percent by weight relative to the photoactive component.

Other optional additives include anti-striation agents, plasticizers, speed enhancers, etc. Dye compounds in addition to the above-discussed resin materials also may be employed if desired. Such optional additives typically will be present in minor concentration in a photoresist composition except for fillers and additional dyes which may be present in relatively large concentrations such as, e.g., in amounts of from 5 to 30 percent by weight of the total weight of a resist's dry components.

The compositions of the invention can be readily prepared by those skilled in the art. For example, a photoresist composition of the invention can be prepared by dissolving the components of the photoresist in a suitable solvent such as, for example, ethyl lactate, a glycol ether such as 2-methoxyethyl ether (diglyme), ethylene glycol monomethyl ether, ethylene glycol monomethyl ether, propylene glycol monomethyl ether; a Cellosolve ester or a ketone such as methyl ethyl ketone. Typically, the solids content of the composition varies between about 5 and 35 percent by weight of the total weight of the photoresist composition. The resin binder and PAG components should be present in amounts sufficient to provide a film coating layer and formation of good quality latent and relief images. See the examples which follow for exemplary preferred amounts of resist components.

The compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon or silicon dioxide wafers for the production of microprocessors and other integrated circuit components. Aluminum-aluminum oxide, gallium arsenide, ceramic, quartz or copper substrates also may be employed. Substrates used for liquid crystal display and other flat panel display applications are also suitably employed, e.g. glass substrates, indium tin oxide coated substrates and the like.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 10 to 300 mJ/cm$^2$, dependent upon the exposure tool and the components of the photoresist composition.

Coating layers of the resist compositions of the invention are preferably photoactivated by an exposure wavelength in the deep U.V. range i.e., 350 nm or less, more typically in the range of about 300 nm or less, typically about 150 to 300 or 350 nm. A particularly preferred exposure wavelength is about 248 nm.

Following exposure, the film layer of the composition is preferably baked at temperatures ranging from about 50° C. to about 160° C. to create or enhance solubility differences between exposed and unexposed regions of a coating layer. For example, negative photoresists typically require post-exposure heating to induce an acid-promoted or base-promoted crosslinking reaction, and many chemically amplified positive-acting resists require post-exposure heating to induce an acid-promoted deprotection reaction.

After any such post-exposure bake, the film is developed, preferably using an aqueous-based developer such as an inorganic alkali exemplified by sodium hydroxide, potassium hydroxide, sodium carbonate, sodium bicarbonate, sodium silicate, sodium metasilicate; quaternary ammonium hydroxide solutions such as a tetra-alkyl ammonium hydroxide solution; various amine solutions such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with art recognized procedures.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a plasma gas etch (e.g. an oxygen plasma etch) and a hydrofluoric acid etching solution. The compositions of the invention are highly resistant to such etchants thereby enabling manufacture of highly resolved features, including lines with submicron widths. After such processing, resist may be removed from the processed substrate using known stripping procedures.

All documents mentioned herein are incorporated herein in their entirety by reference. The following non-limiting examples are illustrative of the invention.

General Comments

In following examples, the methylanthracene methacrylate-hydroxyethyl methacrylate (ANTMA-HEMA) copolymer resin used as a dye in the resist formulations was the material of Formula III produced according to Example 1 which follows, with an Mn, Mw and percent anthracene units and other properties as disclosed in that example. The resin binder material used in the following examples was a copolymer of vinyl phenol and t-butylacrylate having a Mw of about 20,000 and available under the tradename of Maruzen CTBA 161 from Maruzen Oil Company of Tokyo, Japan. The Silwet™ L-7604 leveling agent used in the examples is commercially available from Union Carbide.

EXAMPLE 1

Preparation of Preferred Dye Resins

1. Preparation of Monomers with Chromophores.
   A. Preparation of Chloroxine Methacrylate.
   A 500 ml round bottom flask equipped with magnetic stirrer and nitrogen inlet was charged with 5.0 g (0.0234 mol) 5.7 dichloro-8-hydroxyquinoline (chloroxine), 2.01 (0.0234 mol)methacrylic acid, 500 ml methylene chloride, 1.43 g (0.5 eq.), 4-dimethylamino-pyridine (DMAP) and 6.72 g 1-(3-dimethylamino propyl)-3-ethylcarbodimide (EDCI). The reaction mixture was stirred under a blanket of nitrogen for 12 hours at 25° C. The product was purified by column chromatography (methylene chloride) to give a pale yellow solid (yield 67%).
   B. Preparation of Methylanthracene Methacrylate
   Methylanthracene methacrylate ($CH_3C(=CH_2)CO_2CH_2$-9-anthracene) was prepared as disclosed in *Macromolecules*, 17(2):235 (1984).

2. Preparation of Resins.

Methylanthracene methacrylate (ANTMA)/hydroxyethyl methacrylate (HEMA) copolymer (Formula III below) was prepared as follows.

A 300 ml 3-neck round bottom flask equipped with magnetic stirrer, condenser, nitrogen and vacuum inlet was charged with 16.0 g (0.1229 mol) HEMA (purified by distillation), 8.49 g (0.0307 mol)methylanthracene methacrylate, 0.2449 g (1 wt. %) AIBN and 180 ml THF. The reaction flask was quenched in liquid nitrogen while being purged with nitrogen. When the contents of the reaction flask were frozen, the flask was evacuated, then purged with nitrogen (3 times). The reaction mixture was stirred under reflux for 18 hours. The pale yellow polymer was precipitated into 3000 ml ether, filtered, then dried at 50° C. under vacuum (yield 86%) to provide the ANTMA/HEMA copolymer having 81 mole percent of —$CH_2C(CH_3)$ ($CO_2CH_2CH_2OH$)— units and 19 mole percent of —$CH_2C$ ($CH_3$)($CO_2CH_2$-9-anthracene) units, a Mn of 2295, Mw of 19150 and a Tg of 101° C. This ANTMA/HEMA dye resin had the structure of the following Formula III, with x equal to about 81 percent and y equal to about 19 percent:

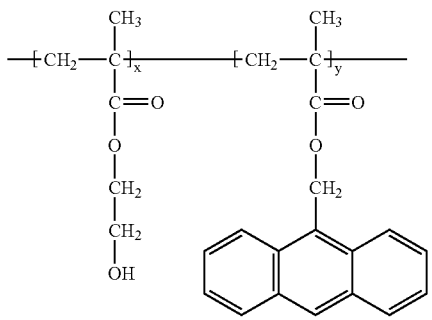

III

Additional ANTMA/HEMA copolymers and HEMA/chloroxine methacrylate copolymers were prepared by similar procedures, with the substitution of chloroxine methacrylate for methylanthracene methacrylate in the case of preparation of HEMA/chloroxine methacrylate copolymers.

EXAMPLE 2

A solution consisting of 10.664 g of ANTMA/HEMA dye solution (5 wt % of ANTMA/HEMA resin of Formula III in ethyl lactate), 2.664 g polyhydroxystyrene-t-butylacrylate copolymer solids, 0.126 g Silwet™ L-7604 Surfactant solution (10% solids in Ethyl Lactate) and 6.525 g additional ethyl lactate was prepared. The solution was filtered through a 0.2 µm pore-size PTFE membrane filter.

Solutions of other dye materials were also formulated, using the same dye concentration as the ANTMA/HEMA copolymer. Those dyes are specified in Table I below. A sample with no dye material was also evaluated.

Quartz and silicon wafers were coated with the dyed polymer solutions for determining optical properties. Wafers were soft baked for 60 seconds at 100° C., vacuum hot plate, on a GCA MicroTrack coat and bake system. Silicon wafers were used for thickness and cauchy coefficient determinations. Absorbance spectra from 200 nm to 500 nm were taken on a Cary 13 UV-VIS Spectrophotometer; absorbance values (ABS) for 248 nm are set forth in Table I below.

Quartz wafers were subsequently baked for 60 seconds at 125° C. and 150° C. (spectral curves run following each bake).

TABLE I

| Dye | % Dye Loading | Soft Bake Temp., ° C. | ABS/1.0 µm @ 248 nm | % Change in ABS |
|---|---|---|---|---|
| 5-Nitrobenzotriazole | 20% | 100 | 1.6659 | — |
| | | 125 | 1.6205 | 2.7% |
| | | 150 | 1.2124 | 27.2% |
| 4-Phenylazodiphenyl-amine | 20% | 100 | 0.7659 | — |
| | | 125 | 0.76448 | 0.1% |
| | | 150 | 0.7000 | 8.6% |
| Aminoanthracene | 20% | 100 | 2.9596 | — |
| | | 125 | 2.7907 | 5.7% |
| | | 150 | 1.5438 | 47.8% |
| t-Butylanthraquinone | 20% | 100 | 1.8004 | — |
| | | 125 | 1.7882 | 0.7% |
| | | 150 | 1.1664 | 35.2% |
| ANTMA/HEMA dye resin (prepared per Ex. 1) | 20% | 100 | 2.0291 | — |
| | | 125 | 2.0603 | −1.5% |
| | | 150 | 2.0849 | −2.7% |
| No Dye | Not applic. | 100 | 0.1267 | — |
| | | 125 | 0.1379 | −8.8% |
| | | 150 | 0.1222 | −3.6% |

EXAMPLE 3

A photoresist composition (Resist 1) consisting of 6.083 g polyhydroxystyrene-t-butylacrylate copolymer solids, 2.432 g di-t-butylphenyliodonium camphorsulfonate photoacid generator solution (10 wt % solids in ethyl lactate), 0.136 g of a tetrabutyl ammonium hydroxide lactate solution (10 wt % solids in ethyl lactate), 0.181 g ANTMA/HEMA dye solution (34 wt % solids in 37.5 vol % Anisole:62.5 vol % propylene glycol monomethyl ether acetate), 0.322 g Silwet™ L-7604 Surfactant solution (10 wt % solids in ethyl lactate) and 30.850 g additional ethyl lactate was prepared.

Two additional photoresists (Resist 2 and Resist 3) were formulated in the samme manner as for Resist 1 and described about, except the amount of ANTMA/HEMA dye solution was varied to adjust the optical density of the photoresist film: Resist 2 contained 0.524 g of the ANTMA/HEMA dye solution and Resist 3 contained 0.864 g of the ANTMA/HEMA dye solution. Resists 1–3 thus contained 1, 3% and 5% dye solids (wt.)/polymer solids (wt.), respectively.

Silicon wafers were primed with HMDS and coated with each of Resists to 0.86 µm film thickness. A Prometrix SM300 film thickness measurement tool was used for film thickness measurements. Quartz wafers were also coated with the photoresists for determining optical properties, with recorded absorbance values specified in Table II below. Wafers were soft baked for 60 seconds at 130° C., vacuum hot plate, on a GCA MicroTrack coat and bake system. Coated wafers were then exposed on a GCA XLS 7800 excimer laser stepper fitted with a reticle consisting of blank quartz or dense line/space pairs and isolated lines. Exposed wafer were then post-exposure baked for 90 seconds at 140° C. and developed with a 60 second single spray puddle on a GCA Microtrack system using Shipley Microposit CD-26 0.26N tetramethylammonium hydroxide developer.

Soft baked, resist coated, wafers were exposed in 0.2 mJ/cm$^2$ increments from 0.2 to 20.0 mJ/cm$^2$ using the blank quartz reticle. Following the post-exposure bake, resists were developed. Required exposure energies were determined (see Table III below) and focus-exposure arrays were run using the dense line/space pairs and isolated line reticle.

TABLE II

| Resist No. | Absorbance Units/1.0 μm |
|---|---|
| Resist 1 | 0.2780 |
| Resist 2 | 0.36390 |
| Resist 3 | 0.60220 |

TABLE III

| Resist No. | Eo Dose | Esize Dose | L/S Resolution |
|---|---|---|---|
| Resist 1 | 3.4 mJ/cm² | 11.0 mJ/cm² | 0.200 μm |
| Resist 2 | 4.2 mJ/cm² | 14.0 mJ/cm² | 0.200 μm |
| Resist 3 | 5.2 mJ/cm² | 18.5 mJ/cm² | 0.200 μm |

EXAMPLE 4

Two photoresists were formulated, one containing the ANTMA/HEMA dye resin of Example 1 above and one without the dye component. The dyed resist consisted of 5.860 g polyhydroxystyrene-t-butylacrylate copolymer solids, 2.345 g di-t-butylphenyl iodonium camphorsulfonate photoacid generator solution (10% solids in ethyl lactate), 0.131 g of a tetrabutylammonium hydroxide lactate solution (10% solids in ethyl lactate), 0.864 g ANTMA/HEMA dye solution (34 wt % solids in 37.5 vol % Anisole:62.5 vol % propylene glycol monomethyl ether acetate), 0.322 g Silwet™ L-7604 surfactant solution (10 wt % solids in ethyl lactate) and 30.491 g additional ethyl lactate. The non-dyed resist contained 13.249 g polyhydroxystyrene-t-butylacrylate copolymer solids, 5.374 g di-t-butylphenyliodonium camphorsulfonate photoacid generator solution (10 wt % solids in ethyl lactate), 0.333 g of a tetrabutylammonium hydroxide lactate solution (10 wt % solids in ethyl lactate) and 80.164 g additional ethyl lactate.

Silicon wafers were primed with HMDS and coated with the resists to cast films from 6600 Å to 7800 Å film thickness. A Prometrix SM300 film thickness measurement tool was used for film thickness measurements. Wafers were soft baked for 60 seconds at 130° C., vacuum hot plate, on a GCA MicroTrack coat and bake system. Coated wafers were then exposed on a GCA XLS 7800 excimer laser stepper fitted with a reticle consisting of blank quartz. Exposed wafers were then post-exposure baked for 90 seconds at 140° C. and developed with a 60 second single spray puddle on a GCA Microtrack system using Shipley Microposit CD-26 0.26N tetramethylammonium hydroxide developer.

Required exposure energy to clear the resist (Eo mJ/cm²), versus film thickness was determined. The resist containing the ANTMA/HEMA resin dye reduced the exposure dose swing by 50%; specifically, the exposure dose swing was approximately 44% for the non-dyed resist and approximately 21% for the resist with the ANTMA/HEMA resin dye.

EXAMPLE 5

Four resists were formulated, three containing the ANTMA/HEMA resin dye at various dye loadings as specified below (to modify the resist film optical density) and one without the dye component. The resists were formulated as follows:

| Component | Non-Dyed 0.24 AU/μm | Low Dye 0.33 AU/μm | Medium 0.45 AU/μm | High 0.59 AU/μm |
|---|---|---|---|---|
| Resin binder | 40.347 g | 40.347 g | 40.347 g | 40.347 g |
| PAG | 1.614 g | 1.614 g | 1.614 g | 1.614 g |
| Stabilizer | 0.090 g | 0.090 g | 0.090 g | 0.090 g |
| Resin dye | 0 | 0.319 g | 0.759 g | 1.295 g |
| Surfactant | 0.210 g | 0.210 g | 0.210 g | 0.210 g |
| Ethyl lactate | 207.740 g | 208.21 g | 208.87 g | 209.683 g |

Resin binder: polyhydroxystyrene-t-butylacrylate copolymer
PAG: Di-t-butylphenyliodonium camphorsulfonate photoacid generator
Resin dye: ANTMA/HEMA copolymer
Surfactant: Silwet ™ L-7604
Stabilizer: TBAH lactate salt Silicon wafers were primed with HMDS and coated with the resists to cast films from 7600 Å (Emin. dose) and 7235 Å (Emax. dose) film thickness. A Prometrix SM300 film thickness measurement tool was used for film thickness measurements. Wafers were soft baked for 60 seconds at 130° C., vacuum hot plate, on a GCA MicroTrack coat and bake system. Coated wafers were then exposed on a GCA XLS 7800 excimer laser stepper fitted with a reticle consisting of blank quartz or dense line/space pairs and isolated lines. Exposed wafers were then post-exposure baked for 90 seconds at 140° C. and developed with a 60 second single spray puddle on a GCA Microtrack system using Shipley Microposit CD-26 0.26 N tetramethylammonium hydroxide developer.

As dyed loading increased, standing waves were significantly reduced as shown by scanning electron micrograph (SEM) analysis of the developed resist relief images.

Resolution and masking linearity capabilities of the medium dyed resist were better than the non-dyed resist as shown by the SEMs.

Further, both depth-of-focus and exposure latitudes improved with the dyed photo resist relative to the non-dyed resist.

EXAMPLE 6

Reproducibility of the properties ANTMA/HEMA resin dye was studied using 3 different synthesis lots of the ANTMA/HEMA resin dye; those lots were designated as follows: Batch 1; Batch 2; and Batch 3.

Three photoresists compositions (Resists 1–3) were prepared. Resist 1 contained 0.142 g of the dye of Batch 1, Resist 2 contained 0.142 g of the dye of Batch 2 and Resist 3 contained 0.142 g of the dye of Batch 3. Each of Resists 1–3 also contained 37.700 g polyhydroxystyrene-t-butylacrylate copolymer solution (20% solids in ethyl lactate), 3.016 g di-t-butylphenyliodonium camphorsulfonate photoacid generator solution (10% solids in ethyl lactate), 0.167 g of a stabilizing additive solution (10% solids in ethyl lactate) and 8.575 g additional ethyl lactate.

Silicon wafers were primed with HMDS and coated with the resists to 0.765 μm film thickness. A Prometrix SM300 film thickness measurement tool was used to measure film thickness. Wafers were soft baked for 60 seconds at 130° C., vacuum hot plate, on a GCA MicroTrack coat and bake system. Coated wafers were then exposed on a GCA XLS 7800 excimer laser stepper fitted with a reticle consisting of blank quartz or dense line/space pairs and isolated lines. Exposed wafer were then post-exposure baked for 90 seconds at 140° C. and developed with a 20 second/25 second double spray puddle on a GCA Microtrack system using Shipley Microposit CD-26 0.26N tetramethylammonium hydroxide developer.

Soft baked, resist coated, wafers were exposed in 0.2 mJ/cm² increments from 0.2 to 20.0 mJ/cm² using the blank quartz reticle. Following the post-exposure bake, resists were developed. Required exposure energies were determined and a focus-exposure arrays were run using the dense line/space pairs and isolated line reticle. Results are set forth in Table IV below.

TABLE IV

| Resist | Eo Dose | Esize Dose | L/S Resolution |
|---|---|---|---|
| Resist 1 | 3.4 mJ/cm² | 10.2 mJ/cm² | 0.220 μm |
| Resist 2 | 3.2 mJ/cm² | 11.2 mJ/cm² | 0.220 μm |
| Resist 3 | 3.2 mJ/cm² | 11.2 mJ/cm² | 0.200 μm |

EXAMPLE 7

The PAG 1 above, (di-(4-t-butylphenyl)iodonium (+/−)-10-camphorsulfonate, can be prepared as follows. A 2 L 3-neck round bottom flask was charged with potassium iodate (214.00 g, 1.00 mol), t-butylbenzene (268.44 g, 2.00 mol) and acetic anhydride (408.36 g, 4.00 mol). The flask was fitted with an efficient overhead paddle stirrer, a thermometer and a pressure equalizing dropping funnel fitted with a $N_2$ bubbler. The reaction mixture was cooled to 10° C. in a ice-water bath and concentrated sulfuric acid (215.78 g, 2.20 mol) added dropwise via the addition funnel. The addition was carried out at such a rate as to maintain the reaction temperature around 25° C. and required 2 hours. As the addition proceeded the starting white suspension became orange-yellow in color. Once the addition was over, the reaction mixture was stirred at room temperature (20° C.) for an additional 22 hours. The reaction mixture was cooled to 5–10° C. and water (600 ml) was added dropwise over a period of 30 minutes, maintaining the temperature below 30° C. (Note the first @75 ml should be added at a particularly slow rate as to control the initial exotherm, thereafter the rest of the water may be added at a faster rate). This cloudy mixture was washed with hexane (3×100 ml) (to remove unreacted t-butylbenzene and some 4-t-butyliodobenzene byproduct) in a 2 L separating funnel and the aqueous solution of diaryliodonium hydrogensulfate transferred to a 3 L reaction vessel. The solution was cooled to 5–10° C., (+/−)-10-camphorsulfonic acid (232.30 g, 1.00 mol) was added in one portion with stirring and the solution was then neutralized with ammonium hydroxide (620 ml, 9.20 mol). The amount of base used was the theoretical amount required to neutralize all acidic species in the pot, assuming quantitative reaction. The addition of the base is carried out at such a rate as to keep the temperature below 25° C. and takes about 1 hour. As the addition nears completion and the pH of the reaction mixture approaches 7, the crude diaryliodonium camphorsulfonate precipitated as a tan solid. This suspension was allowed to stir at room temperature for 3 hours and the material isolated as follows: The tan solid was collected by suction filtration and while still moist taken up in dichloromethane (1 L) and washed with dilute ammonium hydroxide (2.5 wt %, 5 ml 14.8 N $NH_4OH$+195 ml $H_2O$) until the washings are in the pH 7–8 range (1×200 ml) and then water (2×200 ml) to restore the pH to around 7. After drying ($MgSO_4$), the dichloromethane was removed under reduced pressure and the residue further dried in vacuo at 50° C. for 16 hours to give the crude product as a tan solid (390.56 g). The resulting tan solid was then purified by recrystallization in the following manner. The tan solid was dissolved in the minimum amount of refluxing isopropanol (@ 375 g PAG in @ 1150 ml IPA) in a 2 L round bottom flask to give a homogeneous dark red solution. The hot solution was transferred to a 2 L conical flask and allowed to cool. While this solution was still warm, hexane (500 ml) was added and crystals formed soon after. The crystallizing mixture was allowed to cool to room temperature and stored for 4 hours. The crystallizing solution was cooled to @ 5° C. in an ice-water bath for 1.5 hours and then the solid was collected by suction filtration and washed until white with very cold isopropanol-hexane (1:3, 2×200 ml, prepared by cooling the solvent mixture in a dry ice-acetone bath before use). The white solid was dried under aspirator vacuum for 1 hour until the PAG (di-(4-t-butylphenyl)iodonium (+/−)-10-camphorsulfonate) was isolated as a free flowing white powder. At this stage about 285 g of PAG is obtained. A second recrystallization can be performed in a similar manner.

A lactate salt of TBAH (tetra-n-butylammoniumd/1-lactate salt; $[(CH_3CH_2CH_2CH_2)_4NO(CO)CH(OH)CH_3]$) can be prepared as follows. To a solution of tetra-n-butylammonium bromide (16.12 g, 50.0 mmol) in water (50 ml) was added a gray colored suspension of silver lactate (9.85 g, 50.0 mmol) in water (100 ml). As the addition proceeded a grayish white solid, presumably silver bromide, precipitated from solution. The resulting suspension was stirred at room temperature for 15 hours, the solid was filtered off and washed with water (3×50 ml). The combined filtrate and washings were concentrated under reduced pressure and the residual oil dried in vacuo at 50° C. for 24 hours to give the title compound as a colorless oil (16.62 g, 99%). Upon standing at room temperature, this oil later formed a waxy semi-solid.

The foregoing description of the invention is merely illustrative thereof, and it is understood that variations and modifications thereof can be made without departing from the spirit or scope of the invention as set forth in the following claims.

What is claimed is:

1. A photoresist composition that comprises a resin binder, a photoacid generator compound and a dye that comprises a structure of the following formula:

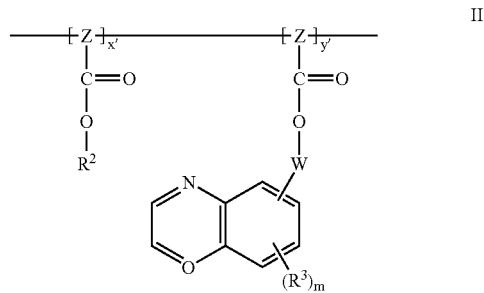

each $R^2$ is independently substituted or unsubstituted alkyl;

W' is a bond or substituted or unsubstituted alkylene;

G is a carbon, nitrogen, oxygen or sulfur;

each $R^3$ may be independently halogen; substituted or unsubstituted alkyl; substituted or unsubstituted alkoxy; substituted or unsubstituted alkenyl; substituted or unsubstituted alkynyl; substituted or unsubstituted alkylthio; cyano; nitro; amino and hydroxy;

m is an integer of from 0 to 7;

x' and y' are mole fractions of the respective units; and each Z is a bridge group between polymer units.

2. The photoresist of claim 1 wherein the polymer has a weight average molecular weight of at least about 5,000.

3. The photoresist of claim 1 wherein the photoresist is a chemically-amplified positive-acting resist.

4. The method of claim 1 wherein the photoresist is a negative-acting resist.

\* \* \* \* \*